United States Patent
Inoue

(10) Patent No.: US 7,750,740 B2
(45) Date of Patent: Jul. 6, 2010

(54) SEMICONDUCTOR CIRCUIT

(75) Inventor: Yusuke Inoue, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/195,051

(22) Filed: Aug. 20, 2008

(65) Prior Publication Data
US 2008/0303597 A1    Dec. 11, 2008

Related U.S. Application Data

(63) Continuation of application No. PCT/JP2006/302977, filed on Feb. 20, 2006.

(51) Int. Cl.
*H03F 3/68*    (2006.01)
(52) U.S. Cl. ...................... 330/295
(58) Field of Classification Search ............ 330/53, 330/124 R, 295; 333/125, 128, 136
See application file for complete search history.

(56) References Cited

U.S. PATENT DOCUMENTS 4,823,096 A * 4/1989 Hash ................ 333/109

7,170,353 B2 * 1/2007 Amano ................ 330/295

FOREIGN PATENT DOCUMENTS

| JP | 3-250807 A | 11/1991 |
|---|---|---|
| JP | 10-224157 A | 8/1998 |
| JP | 11-097945 A | 4/1999 |
| JP | 01-251808 A | 10/1999 |
| JP | 2001-244710 A | 9/2001 |
| JP | 2003-124063 A | 4/2003 |
| JP | 2003-209447 A | 7/2003 |
| JP | 2004-56818 A | 2/2004 |
| JP | 2005-101946 A | 4/2005 |

* cited by examiner

*Primary Examiner*—Steven J Mottola
(74) *Attorney, Agent, or Firm*—Arent Fox LLP

(57) ABSTRACT

There are included a Wilkinson divider/combiner dividing an input signal, amplifying elements amplifying outputs of the Wilkinson divider/combiner, and a Wilkinson divider/combiner combining outputs of respective amplifying elements. A variable capacitor element is connected to a branch point of a signal transmission path in the Wilkinson divider/combiner. A capacitance value of the variable capacitor element is controlled in correspondence with a frequency of an input signal, whereby a matching frequency is corrected to increase an operating frequency band.

12 Claims, 5 Drawing Sheets

F I G. 1
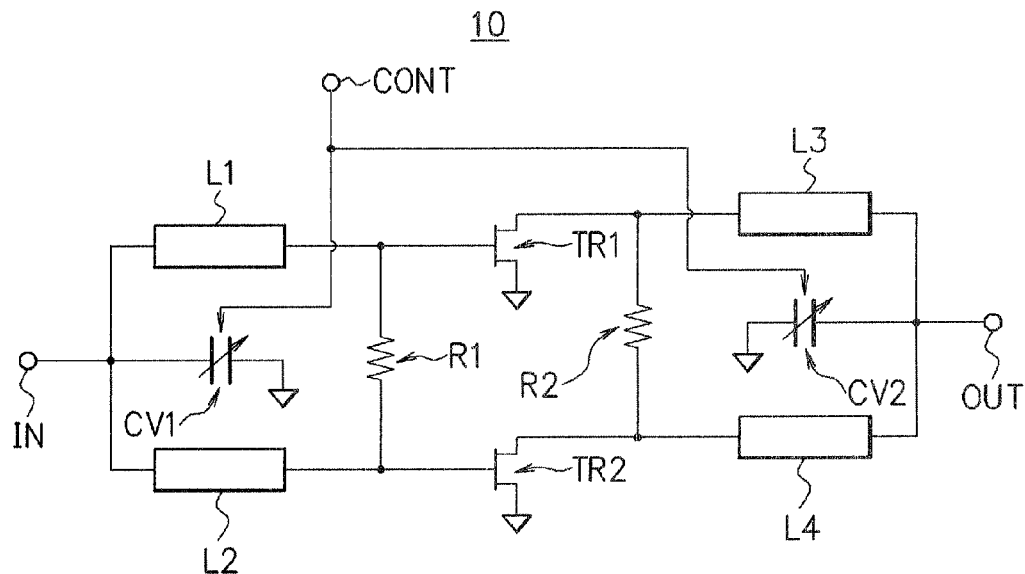
F I G. 2
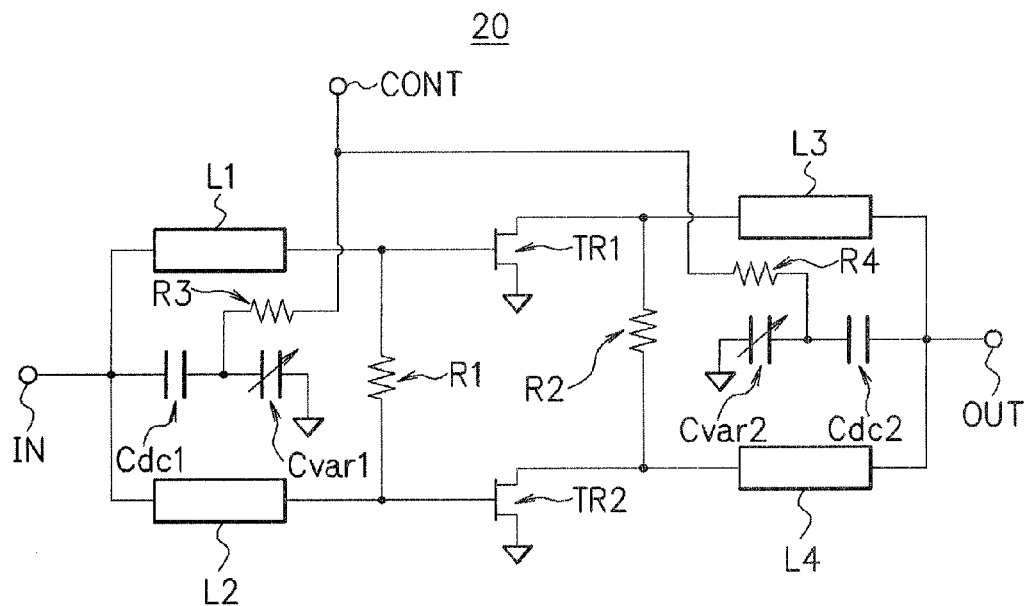

|  | WITHSTAND VOLTEGE | RESPONSE SPEED | PRICE |
|---|---|---|---|
| FET | SEVERAL V TO 200V | SEVERAL ns TO SEVERAL us | LOW PRICE |
| VARACTOR DIODE | SEVERAL V TO 200V | SEVERAL ns TO SEVERAL us | LOW PRICE |
| MEMS | 100V TO SEVERAL k V | SEVERAL HUNDRED us TO SEVERAL ms | HIGH PRICE |

INPUT WAVEFORM

OUTPUT WAVEFORM 101    102

SEMICONDUCTOR CIRCUIT

TECHNICAL FIELD

The present invention relates to a semiconductor circuit.

BACKGROUND

In order to output an extremely large electric power of 10 W or more, a high power amplifier using an amplifying element with a high saturation power such as, for example, a transistor having a large gate width is necessary. As a circuit to realize the above, there is an amplifier (combining type amplifier) based on power composition by a Wilkinson divider/combiner (for example, see Japanese Patent Application Laid-open No. 2003-209447). This amplifier, using the Wilkinson divider/combiner, divides a signal for a plurality of amplifying elements (for example, transistors) and obtains a large saturation power by combining outputs of those amplifying elements. However, there is a problem with this amplifier in that a circuit size becomes large since characteristic impedance of both transmission lines disposed in the Wilkinson divider/combiner is low.

As a solution for this problem, a high power amplifier (combining type amplifier) 90 shown in FIG. 9 is suggested (for example, see Japanese Patent Application laid-open No. 2001-244710).

The amplifier 90 shown in FIG. 9 includes a first Wilkinson divider/combiner functioning as a divider, transistors TR1, TR2 being amplifying elements, and a second Wilkinson divider/combiner functioning as a combiner. The first Wilkinson divider/combiner is constituted with transmission lines L1, L2, a capacitor element C1, and an isolation resistor R1, while the second Wilkinson divider/combiner is constituted with transmission lines L3, L4, a capacitor element C2, and an isolation resistor R2.

A high frequency signal inputted to the amplifier 90 via an input terminal IN is divided into two by the first Wilkinson divider/combiner and branch-outputted to the transistors TR1, TR2. The branch-outputted high frequency signals are, after amplified by the transistors TR1, TR2 respectively, combined by the second Wilkinson divider/combiner and outputted from an output terminal OUT.

In the high power amplifier 90 shown in FIG. 9, though there are used the transmission lines L1 to L4 whose electric lengths are shorter than (¼) wavelength in wirings only in the Wilkinson dividers/combiners, the capacitor elements C1, C2 are inserted into branch points so that the electric lengths become (¼) wavelength, whereby miniaturization of a circuit is enhanced.

Here, in the high power amplifier 90 shown in FIG. 9, when sizes of the transistors TR1, TR2 become large, it is necessary to increase capacitance values of the capacitor elements C1, C2 in order to attain impedance matching. As a result, an operating frequency band of the high power amplifier 90 becomes quite narrow.

FIG. 10 is a diagram to explain the operating frequency band of the high power amplifier 90 shown in FIG. 9. In FIG. 10, there is shown, as an example, input and output waveforms in a case that a chirp modulation being the easiest frequency modulation method is performed. When a frequency of a signal inputted via the input terminal IN, the signal being indicated by the input waveform, is low or high, an amplified waveform is deteriorated due to lack of the frequency band as indicated by the output waveform (see 101, 102) outputted from the output terminal OUT.

SUMMARY

An aspect of the invention, a semiconductor circuit includes a Wilkinson divider/combiner dividing an input signal, amplifying elements amplifying outputs of the Wilkinson divider/combiner, and a Wilkinson divider/combiner combining the outputs of the respective amplifying elements. Variable capacitor elements are connected to branch points of signal transmission paths in these Wilkinson dividers/combiners.

BRIEF DESCRIPTION OF THE DRAWINGS

FIG. 1 is a diagram showing a constitution example of a high power amplifier to which a semiconductor circuit according to an embodiment of the present invention is applied;

FIG. 2 is a diagram showing an example of a concrete constitution of the high power amplifier in the present embodiment;

DETAILED DESCRIPTION OF THE PREFERRED EMBODIMENTS

Hereinafter, an embodiment of the present invention will be described based on the drawings.

Figures 9, 10:
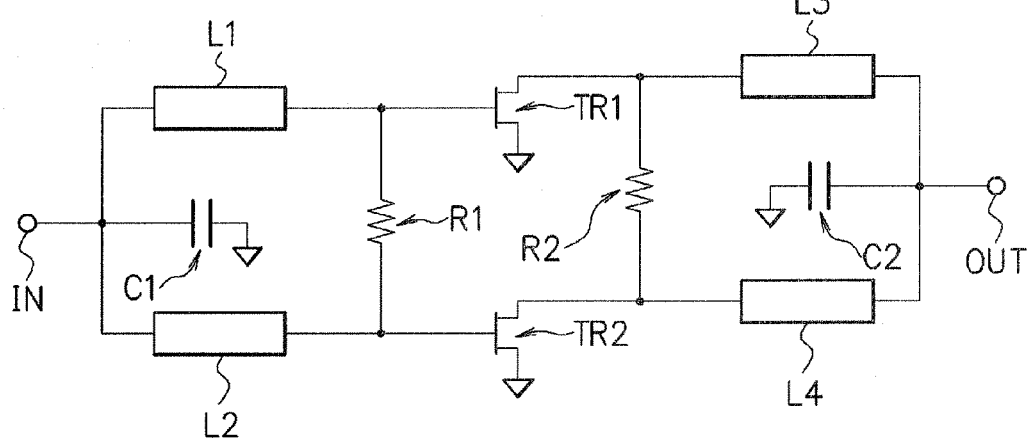
FIG. 9 is a diagram showing a configuration of a conventional high power amplifier.
FIG. 10 is a diagram showing an example of input and output waveforms of the high power amplifier shown in FIG. 9.

FIG. 1 is a diagram schematically showing a configuration example of a high power amplifier 10 to which a semiconductor circuit according to an embodiment of the present invention is applied. The high power amplifier 10 shown in FIG. 10 is a combining type amplifier based on power composition by a Wilkinson divider/combiner, and is applicable to a radio system using a frequency modulation method, for example.

As shown in FIG. 1, the high power amplifier 10 includes a first Wilkinson divider/combiner, transistors TR1, TR2 being amplifying elements, and a second Wilkinson divider/combiner.

The first Wilkinson divider/combiner functions as a divider dividing a high frequency signal (input signal) inputted from an input terminal IN at a common mode (equiphase) to output as divided signals (branch outputs). The first Wilkinson divider/combiner has transmission lines (distributed constant lines) L1, L2, an isolation register R1, and a variable capacitor element CV1.

One ends of the transmission lines L1, L2 are connected to the input terminal IN. The other end of the transmission line L1 is connected to a gate of the transistor TR1, while the other end of the transmission line L2 is connected to a gate of the transistor TR2. The isolation resistor R1 is connected to between the above-described other ends of the transmission lines L1 and L2.

The variable capacitor element CV1 is connected to a branch point (connection point to which the transmission lines L1, L2 are common-connected for the input terminal IN) of a signal transmission path in the first Wilkinson divider/combiner. More detailedly, in the variable capacitor element CV1, one electrode is connected to the branch point of the signal transmission path while the other electrode is grounded. A capacitance value of the variable capacitor element CV1 is controlled by a control signal (control voltage) inputted from a control terminal CONT.

The transmission lines L1, L2 of the first Wilkinson divider/combiner are transmission lines having electric lengths of less than ¼ wavelength. The (variable) capacitor element CV1 is connected to the transmission lines L1, L2 having the electric lengths of less than (¼) wavelength, whereby electric lengths of about (¼) wavelength are realized by the transmission lines L1, L2 and the capacitor element CV1

The transistors TR1, TR2 amplify and output the divided signals outputted from the first Wilkinson divider/combiner. The transistors TR1, TR2 receive the divided signals from the first Wilkinson divider/combiner at gates equivalent to input terminals as the amplifying elements and output the amplified divided signals from drains equivalent to output terminals as the amplifying elements. It should be noted that sources of the transistors TR1 TR2 are grounded.

The second Wilkinson divider/combiner functions as a combiner combining the outputs of the transistors TR1 TR2 at a common mode (equiphase) to output an acquired combined signal (output signal) from an output terminal OUT. The second Wilkinson divider/combiner has transmission lines (distributed constant lines) L3, L4, an isolation register R2, and a variable capacitor element CV2.

One end of the transmission line L3 is connected to a drain of the transistor TR1 while one end of the transmission line L4 is connected to a drain of the transistor TR2. The other ends of the transmission lines L3, L4 are connected to the output terminal OUT. The isolation resistor R2 is connected to between the above-described one ends of the transmission lines L3 and L4.

The variable capacitor element CV2 is connected to a branch point (connection point to which the transmission lines L3, L4 are common-connected for the output terminal OUT) of a signal transmission path in the second Wilkinson divider/combiner. More detailedly, in the variable capacitor element CV2, one electrode is connected to the branch point of the signal transmission path while the other electrode is grounded. A capacitance value of the variable capacitor element CV2 is controlled by the control signal (control voltage) inputted from the control terminal CONT.

The transmission lines L3, L4 of the second Wilkinson divider/combiner are transmission lines having electric lengths of less than ¼ wavelength. The (variable) capacitor element CV2 is connected to the transmission lines L3, L4 having the electric lengths of less than (¼) wavelength, whereby electric lengths of about (¼) wavelength is realized by the transmission lines L3, L4 and the capacitor element CV2.

The input signal (high frequency signal) inputted from the input terminal IN is divided for the transmission lines L1, L2 of two signal transmission paths at a common mode and equal amplitude in the first Wilkinson divider/combiner, and outputted as divided signals to the transistor TR1, TR2. The divided signals are amplified in the transistors TR1, TR2 respectively and outputted to the second Wilkinson divider/combiner. In the second Wilkinson divider/combiner, the amplified high frequency signals transmitted through the transmission lines L3, L4 of the two signal transmission paths are combined and outputted from the output terminal OUT.

Here, the control signal (control voltage) corresponding to a frequency of the signal inputted from the input terminal IN is supplied to the control terminal CONT of the high power amplifier 10, and the capacitance values of the variable capacitor elements CV1, CV2 are controlled. More specifically, it is set so that the capacitance value is large when the frequency of the input signal is low, and that the capacitance value is small when the frequency of the input signal is high. Thereby, it becomes possible to shift a matching frequency in the high power amplifier 10 (Wilkinson divider/combiner) to a low frequency side when the frequency of the input signal is low, and to shift the matching frequency to a high frequency side when, in contrast, the frequency of the input signal is high, so that an operating frequency band can be increased.

FIG. 2 is a diagram showing an example of a concrete configuration of a high power amplifier in the embodiment. In this FIG. 2, the same reference numerals and symbols are given to components having the same functions as those of components shown in FIG. 1 and redundant description will be omitted.

In a high power amplifier 20 shown in FIG. 2, a first Wilkinson divider/combiner functioning as a divider has transmission lines L1, L2, an isolation resistor R1, a capacitor element Cdc1, and a variable capacitor element Cvar1.

The variable capacitor element Cvar1 is connected to a branch point of a signal transmission path in the first Wilkinson divider/combiner via the capacitor element Cdc1 for galvanically separating the branch point of the signal transmission path and the variable capacitor element Cvar1. More detailedly, one electrode of the variable capacitor element Cvar1 is connected to one electrode of the capacitor element Cdc1 and the other electrode is grounded. The other electrode of the capacitor element Cdc1 is connected to the branch point of the signal transmission path.

An interconnection point of the variable capacitor element Cvar1 and the capacitor element Cdc1 is connected to a control terminal CONT via a resistor R3, so that a capacitance value of the variable capacitor element Cvar1 is controlled by a control signal (control voltage) inputted from the control terminal CONT.

Similarly, a second Wilkins divider/combiner functioning as a combiner has transmission lines L3, L4, an isolation resistor R2, a capacitor element Cdc2, and a variable capacitor element Cvar2.

The variable capacitor element Cvar2 is connected to a branch point of a signal transmission path in the second Wilkinson divider/combiner via the capacitor element Cdc2 for galvanically separating the branch point of the signal transmission path and the variable capacitor element Cvar2. One electrode of the variable capacitor element Cvar2 is connected to one electrode of the capacitor element Cdc2 and the other electrode is grounded. The other electrode of the capacitor element Cdc2 is connected to the branch point of the signal transmission path.

An interconnection point of the variable capacitor element Cvar2 and the capacitor element Cdc2 is connected to the control terminal CONT via a resistor R4, so that a capacitance value of the variable capacitor element Cvar2 is controlled by the control signal (control voltage) inputted from the control terminal CONT.

Figure 3:
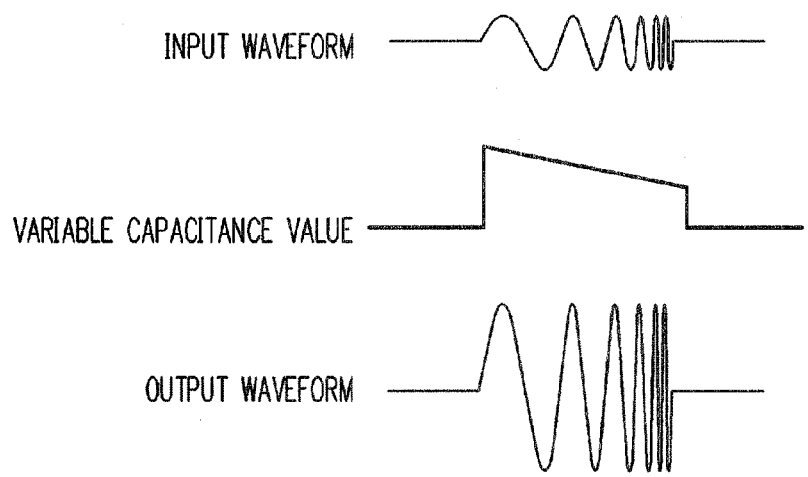
FIG. 3 is a diagram showing a relationship of input and output waveforms and a variable capacitance value in the high power amplifier shown in FIG. 2.

A relationship between input and output waveforms and the variable capacitance value in the high power amplifier 20 shown in FIG. 2 will be shown in FIG. 3. In FIG. 3, the input waveform indicates a waveform of the input signal (high frequency signal) inputted from an input terminal IN, while the output waveform indicates a waveform of a signal (high frequency signal after amplification) outputted from an output terminal OUT. The variable capacitance value indicates the capacitance value of the variable capacitor elements Cvar1, Cvar2.

A case in which a chirp modulation is performed is shown as an example in FIG. 3. It is controlled so that the capacitance value of the variable capacitor element is made smaller in correspondence with chirp in a direction to increase the frequency of the input signal. Thereby, a matching frequency of the high power amplifier 20 is shifted to a high frequency side in correspondence with increase of the frequency of the input signal, so that a good amplified waveform without deterioration (see 101, 102 shown in FIG. 10) can be obtained in a broad frequency band.

Figure 4:
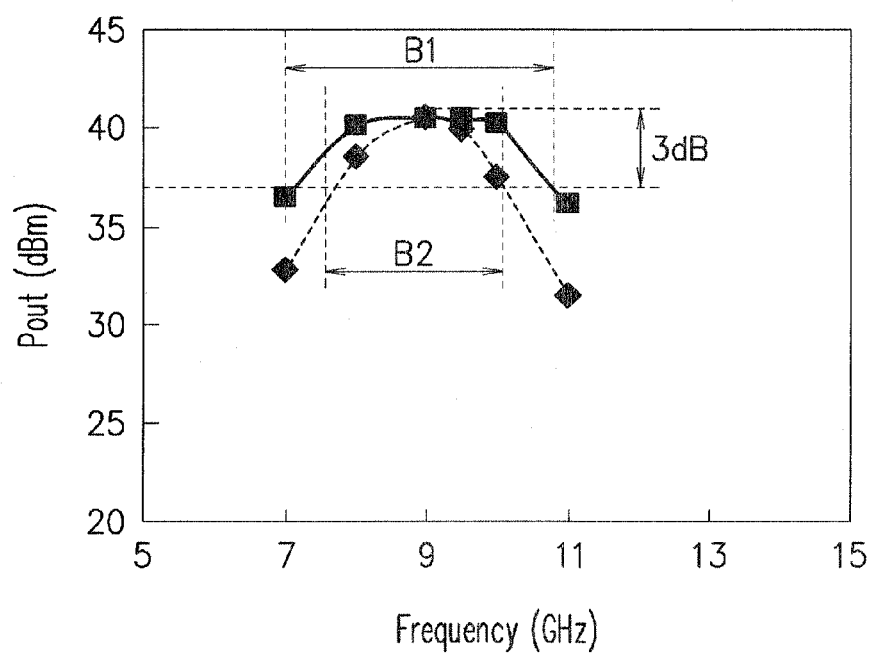
FIG. 4 is a graph to explain an operating frequency band of the high power amplifier shown in FIG. 2.

FIG. 4 is a graph to explain an operating frequency band of the high power amplifier 20 shown in FIG. 20. In FIG. 4 is indicated a frequency characteristic of output power of the high power amplifier 20 to which a 0.5 μm GaN (gallium nitride)-HEMT (high electron mobility transistor) technology is applied. The frequency characteristic of the output power of the high power amplifier 20 is indicated by a solid line while a frequency characteristic of output power of a high power amplifier 90 shown in FIG. 9 for comparison is indicated by a broken line.

In the high power amplifier 90, since capacitors C1, C2 have large capacitance values and the capacitance values are constant, an operating frequency band is limited to a range B2 as shown in FIG. 4. In contrast, in the high power amplifier 20 in the present embodiment, it is possible to vary the matching frequency by connecting the variable capacitor element to the branch point of the signal transmission path in the Wilkinson divider/combiner to vary its capacitance value. Accordingly, as shown in FIG. 4, the high power amplifier 20 has a broader operating range B1 compared with the high power amplifier 90.

Figures 5, 6:
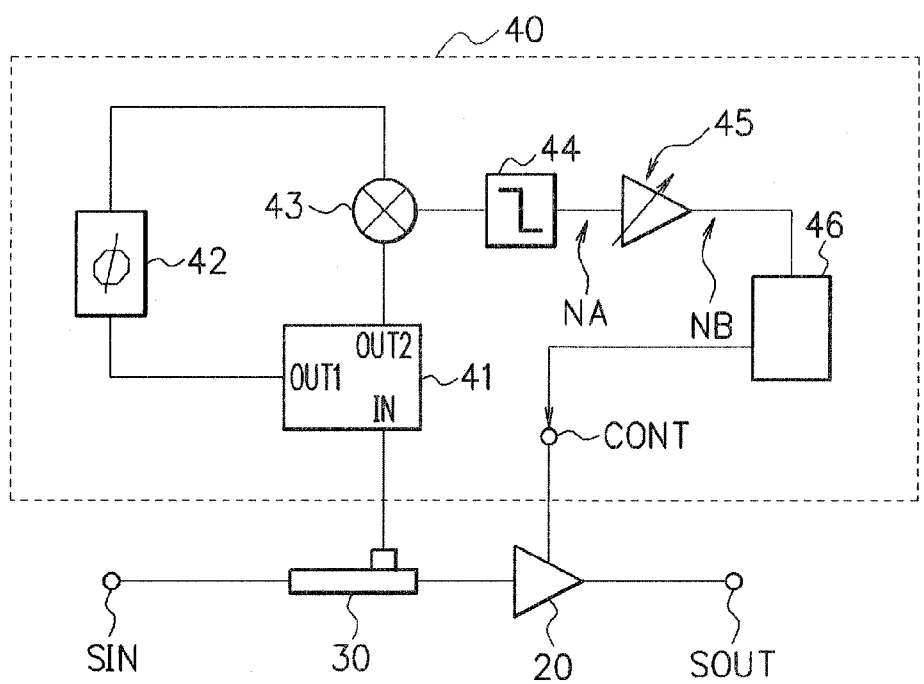
FIG. 5 is a table showing an example of a variable capacitor element applicable in the present embodiment.
FIG. 6 is a diagram showing a configuration example of a control circuit generating a control signal.

An example of a circuit element applicable to the variable capacitor elements CV1, CV2 (Cvar1, Cvar2) in the high power amplifier in the present embodiment is shown in FIG. 5. As shown therein, as the variable capacitor element in the present embodiment, a field effect transistor (FET), a varactor diode, and MEMS (Micro Electro Mechanical Systems) are applicable. Selection from these variable capacitor elements may be performed accordingly in correspondence with a required specification, cost, and the like. It should be noted that to the field effect transistor, a CMOS, InP (indium phosphide)-HEMT, Inp-HBT (hetero-junction bipolar transistor), GaN-HEMT, and SiC (silicon carbide)-HEMT and the like are applicable.

Figure 7:
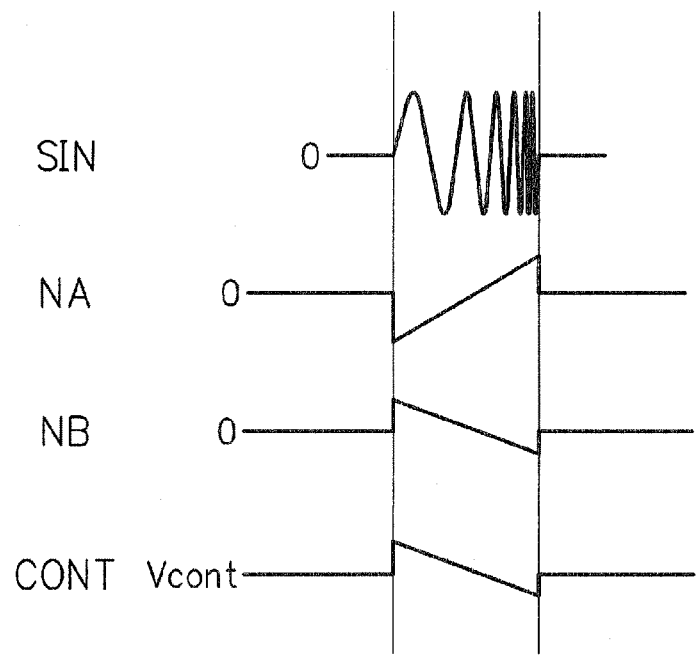
FIG. 7 is a diagram to explain an operation of the control circuit shown in FIG. 6.

FIG. 6 is a diagram showing a configuration example of a control circuit generating a control signal supplied to a control terminal CONT, and FIG. 7 is a diagram to explain an operation of the control circuit shown in FIG. 6.

In FIG. 6, a reference numeral 20 indicates a high power amplifier in the present embodiment, a reference numeral 30 indicates a coupler, and a reference numeral 40 indicates a control circuit. The control circuit 40 has a divider 41, a phase shifter 42, a mixer 43, a low pass filter 44, a variable gain amplifier 45, and a level shifter 46.

An input signal (frequency-modulated pulse signal) inputted from an input terminal SIN is supplied to the input terminal IN of the high power amplifier 20 and a part thereof is taken out by the coupler 30 and supplied to the divider 41 in the control circuit 40. The signal supplied to the divider 41 is branched to two paths and inputted to an RF (high frequency) port and an LO (local) port of the mixer 43. Of the signals divided for two paths and transmitted, the signal transmitted through one of the paths is inputted to the mixer 43 via the phase shifter 42, that is, with being phase-shifted. Then, a filter processing is performed to an output of the mixer 43 by the low pass filter 44, whereby a signal wave NA shown in FIG. 7 is obtained at a node NA.

Further, a voltage deviation in pulse in an output (signal indicated by the signal waveform NA) of the filter 44 is adjusted by the variable gain amplifier 45, whereby a signal waveform NB shown in FIG. 7 can be obtained at a node NB. Further, a voltage level in pulse in an output (signal indicated by the signal waveform NB) of the variable gain amplifier is adjusted by the level shifter 46, whereby a signal waveform CONT shown in FIG. 7 can be supplied to a control terminal CONT.

As stated above, the control circuit 40 performs adjustment of the voltage deviation and the voltage level for the signal obtained based on the input signal inputted from the input terminal SIN and inputted to the high power amplifier 20, whereby a desired control signal can be generated in correspondence with the frequency of the input signal and be supplied to the control terminal of the high power amplifier 20.

Thereby, it is possible to supply a suitable control signal (control voltage) corresponding to a frequency of an input signal to a control terminal provided to control a capacitance value of a variable capacitor element of a high power amplifier. Accordingly, it becomes possible to set so that the capacitance value of the variable capacitor element is large when the frequency of the input signal is low and to set so that the capacitance value of the variable capacitor element is small when the frequency of the input signal is high, and a broadband operation of the high power amplifier in the present embodiment can be realized.

As described above, according to the present embodiment, the capacitance value of the variable capacitor element is controlled in correspondence with the frequency of the input signal inputted from the input signal IN. Thereby, the matching frequency in the high power amplifier (more detailedly, Wilkinson divider/combiner) is properly corrected in correspondence with the input signal, so that the signal can be amplified without deterioration of gain in the broad frequency range, and the operating frequency band can be made large.

Figure 8:
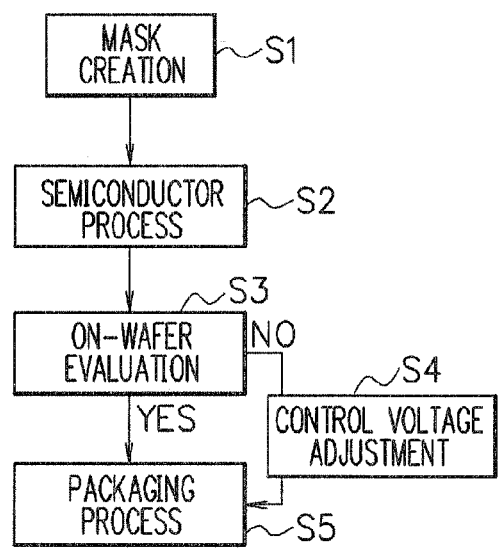
FIG. 8 is a chart showing an example of manufacturing processes of the semiconductor circuit according to the present embodiment.

When the semiconductor circuit as the high power amplifier in the present embodiment, respective processes of mask creation (S1), semiconductor process (S2), on-wafer evaluation (S3), and packaging process (S5) are sequentially performed as shown in FIG. 8. For example, in a case that a high power amplifier is created, when a matching frequency is not a desired frequency at the on-wafer evaluation (S3), conventionally, returning to the process of the mask creation (S1) is done and the processes S1 to S3 are performed again. In contrast, according to the present embodiment, it becomes possible, when a matching frequency is not a desired frequency at the on-wafer evaluation (S3), to cope with the matter by adjustment (S4) for a control voltage supplied to the control terminal, without returning to the process of the mask creation (S1), and shortening of a work period and cost reduction can be enhanced.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. A semiconductor circuit comprising:
   a first Wilkinson divider/combiner dividing and outputting an input signal inputted from an input terminal;
   amplifying elements amplifying outputs of said first Wilkinson divider/combiner;
   a second Wilkinson divider/combiner combining outputs of said amplifying elements and outputting as an output signal from an output terminal;
   variable capacitor elements being connected to branch points of signal transmission paths in said first and second Wilkinson dividers/combiners;
   a control terminal to which a control signal to control a capacitance value of the variable capacitor element is inputted; and
   a control circuit generating the control signal based on the input signal and supplying to said control terminal.

2. The semiconductor circuit according to claim 1, wherein said control circuit includes
   a mixer to which the input signal and a phase-shifted input signal are inputted;
   a low pass filter to which an output of said mixer is inputted; and
   an adjusting circuit to which an output of said low pass filter is inputted and which adjusts its voltage deviation and voltage level to output as the control signal.

3. The semiconductor circuit according to claim 1, wherein a capacitance value of the variable capacitor element is controlled in correspondence with a frequency of the input signal.

4. The semiconductor circuit according to claim 3, wherein the variable capacitor element is controlled to make the capacitance value large when the frequency of the input signal is low and to make the capacitance value small when the frequency of the input signal is high.

5. The semiconductor circuit according to claim 1, wherein the variable capacitor elements are connected to the branch points of signal transmission paths of said first and second Wilkinson dividers/combiners via capacitor elements.

6. The semiconductor circuit according to claim 1, wherein the variable capacitor element is a field effect transistor.

7. The semiconductor circuit according to claim 1, wherein the variable capacitor element is a varactor diode.

8. The semiconductor circuit according to claim 1, wherein,
   the variable capacitor element is a MEMS (Micro Electro Mechanical Systems) element.

9. A semiconductor circuit comprising:
   a divider having first and second transmission lines whose one ends are connected to an input terminal, and a first variable capacitor element whose one electrode is connected to a branch point related to the first and second transmission lines and whose the other electrode is grounded;
   a first amplifying element whose input terminal is connected to the other end of the first transmission line;
   a second amplifying element whose input terminal is connected to the other end of the second transmission line;
   a combiner having third and fourth transmission lines whose one ends are connected to output terminals of said first and second amplifying elements respectively and whose the other ends are connected to an output terminal, and a second variable capacitor element whose one electrode is connected to a branch point related to the third and fourth transmission lines and whose the other electrode is grounded;
   a control terminal to which a control voltage to control capacitance values of the first and second capacitor elements is supplied; and
   a control circuit generating the control voltage based on an input signal inputted from the input terminal and supplying to said control terminal.

10. The semiconductor circuit according to claim 9, wherein
    said divider further has a first capacitor element whose one electrode is connected to the branch point related to the first and second transmission lines, and the one electrode of the first variable capacitor element is connected to the other electrode of the first capacitor element, and
    said combiner further has a second capacitor element whose one electrode is connected to the branch point related to the third and fourth transmission lines, and the one electrode of the second variable capacitor element is connected to the other electrode of the second capacitor element.

11. The semiconductor circuit according to claim 10, wherein
    an interconnection point of the first variable capacitor element and the first capacitor element and an interconnection point of the second variable capacitor element and the second capacitor element are respectively connected to said control terminal.

12. The semiconductor circuit according to claim 9, wherein an electric length of each of the transmission lines is less than ¼ wavelength.

* * * * *